(12) United States Patent
Yamada

(10) Patent No.: US 9,337,794 B2
(45) Date of Patent: May 10, 2016

(54) ARRAY MICROPHONE DEVICE AND GAIN CONTROL METHOD

(71) Applicant: PANASONIC CORPORATION, Osaka (JP)

(72) Inventor: Katsushi Yamada, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 232 days.

(21) Appl. No.: 14/102,007

(22) Filed: Dec. 10, 2013

(65) Prior Publication Data

US 2014/0098972 A1 Apr. 10, 2014

Related U.S. Application Data

(63) Continuation of application No. PCT/JP2011/004746, filed on Aug. 25, 2011.

(30) Foreign Application Priority Data

Jun. 16, 2011 (JP) .................................. 2011-134562

(51) Int. Cl.
*H04R 3/00* (2006.01)
*H03G 3/20* (2006.01)
(Continued)

(52) U.S. Cl.
CPC .................. *H03G 3/20* (2013.01); *H04R 3/005* (2013.01); *H04R 29/006* (2013.01); *H04R 1/406* (2013.01)

(58) Field of Classification Search
CPC .......................... H04R 3/005; H04R 2201/401
USPC .............................................. 381/60, 92, 107
See application file for complete search history.

(56) References Cited

U.S. PATENT DOCUMENTS 6,707,912 B2 * 3/2004 Stephens ............... H04M 9/082
                                                     379/406.01
7,333,605 B1 * 2/2008 Zhang .................. H04M 9/082
                                                     370/286

(Continued)

FOREIGN PATENT DOCUMENTS

CN 101668243 A 3/2010
CN 102024456 A 4/2011

(Continued)

OTHER PUBLICATIONS

Supplementary European Search Report, issued in corresponding European Patent Application No. 11867814 on Oct. 8, 2014; 5 pages.

(Continued)

*Primary Examiner* — Alexander Jamal
(74) *Attorney, Agent, or Firm* — McDermott Will & Emery LLP

(57) ABSTRACT

The array microphone device has a microphone array composed of a plurality of microphone units, having a signal input section for inputting a signal from the microphone units to be corrected as a signal to be corrected; a reference signal input section; a gain variable section for making the levels of the signal to be corrected and the reference signal equal; and a gain control section. The gain control section includes a high-speed gain update section for changing the gain with a first amount of change per unit time upon time elapsed since the array microphone device is starting-up being below a predetermined period of time; and a low-speed gain update section for changing the gain with a second amount of change per unit time upon the elapsed time being above the predetermined period of time, the second amount of change being smaller than the first amount of change.

6 Claims, 7 Drawing Sheets

(51) Int. Cl.
*H04R 29/00* (2006.01)
*H04R 1/40* (2006.01)

(56) References Cited

U.S. PATENT DOCUMENTS

| | | |
|---|---|---|
| 2005/0276423 A1 | 12/2005 | Aubauer et al. |
| 2008/0044034 A1* | 2/2008 | Hou ................ H04R 25/70 381/60 |
| 2008/0175407 A1* | 7/2008 | Zhang ................ H04R 3/005 381/92 |
| 2009/0136057 A1 | 5/2009 | Taenzer |
| 2009/0323980 A1* | 12/2009 | Wu ................ H04R 3/005 381/92 |
| 2011/0069846 A1 | 3/2011 | Cheng et al. |
| 2011/0075859 A1 | 3/2011 | Kim et al. |

FOREIGN PATENT DOCUMENTS

| | | |
|---|---|---|
| JP | 07-131886 A | 5/1995 |
| JP | 2001-177900 A | 6/2001 |
| JP | 2002-540696 A | 11/2002 |
| JP | 2003-259479 A | 9/2003 |

OTHER PUBLICATIONS

International Search Report issued in PCT/JP2011/004746, dated Sep. 27, 2011.

* cited by examiner

ARRAY MICROPHONE DEVICE AND GAIN CONTROL METHOD

CROSS REFERENCE TO RELATED APPLICATION

This application is a continuation of PCT application No. PCT/JP2011/004746, which was files on Aug. 25, 2011 based on Japanese Patent Application (No. 2011-134562) filed on Jun. 16, 2013, the contents of which are incorporated herein by reference. Also, all the references cited herein are incorporated as a whole.

BACKGROUND OF THE INVENTION

1. Technical Field

The present invention relates to an array microphone device, and, more specifically, to an array microphone device having a sensitivity correction function.

2. Background Art

An array microphone device has been conventionally known as one of directional microphones. The array microphone device, in which a plurality of microphones is arranged, executes the signal processing on the input sound so as to be able to acquire spatial information of a sound that cannot be obtained by a single microphone. Thereby, the directivity control is applied, and estimation can be made for the direction from which the sound is approaching. In recent years, the array microphone device has been used in the directivity control for picking up the sound in a remote sound pickup or an in-car hands-free call system at a high S/N (signal-to-noise) ratio.

An array microphone device of this type, which has been known, has such a function (a sensitivity correction function) to correct automatically sensitivity of each of the microphone units, constituting the microphone array, so as to have the identical characteristics (refer to Publication of JP-A-H07-131886, for example). In such an array microphone device, a sensitivity correction means for correcting the sensitivity is provided at the stage prior to a directivity synthesis means for executing the directivity synthesis. Then, the directivity synthesis means operates normally based on the condition such that all of incoming signals are kept at the same level even in the case where the sensitivity of each microphone unit or the sensitivity of associated circuits such as a microphone amplifier (which are simply referred to collectively as the microphone unit sensitivity) are not identical for the reasons of chronological change, manufacturing process, and so on.

SUMMARY

In the conventional array microphone device, however, when a gain is updated with large amount per hour at the time of amplifying or attenuating a signal from each of the microphone units, this may cause an auditory fluctuation of sound and degradation in distortion rate. Furthermore, since the sensitivity correction function always operates in order to trace chronological change, it is generally required to control the updated amount of gain per hour to be a tiny amount so as to bring no influence on sound quality or distortion rate of sound, those picked up by the array microphone device. Furthermore, in the case where the updated amount of gain once becomes large, this requires a long time to converge the gain in case of the updated amount of gain per hour being made with a tiny amount.

Such a circumstances bring about lower performance of the array microphone device at the time of start-up, which might be caused by directivity synthesis failure. Also brought about is to increase in manufacturing cost of the array microphone device for the reason of increased inspection time at the inspection stage in manufacturing.

In light of the aforementioned circumstances, the present invention is made, and the purpose thereof is to provide an array microphone device and a gain control method which maintain sound quality and also achieve a high-speed convergence in the sensitivity correction.

An array microphone device according to the invention having a microphone array composed of a plurality of microphone units, comprises: a to-be-corrected signal input section configured to input a signal from a microphone unit to be corrected out of the plurality of microphone units as a signal to be corrected; a reference signal input section configured to input a reference signal; a gain variable section configured to amplify or attenuate the signal to be corrected so that a level of the signal to be corrected and a level of the reference signal is substantially equal to each other; and a gain control section configured to control a gain at the time of amplifying or attenuating the signal to be corrected, wherein: the gain control section includes: a first gain update section configured to change the gain with a first amount of change per unit time upon time elapsed since the array microphone device is starting-up being below a predetermined period of time; and a second gain update section configured to change the gain with a second amount of change per unit time upon the elapsed time being above or equal to the predetermined period of time, the second amount of change being smaller than the first amount of change.

The structure realizes a quick adjustment in the sensitivity of the microphone unit, which is to be corrected to a reference level at the time of starting-up the array microphone device. Thereby, it is possible to withhold degradation in performance due to directivity synthesis failure, and shorten the inspection time at the inspection stage in manufacturing, which turns out reducing the manufacturing cost.

Furthermore, after the start-up operation, the sensitivity of the microphone unit can be also adjusted to the reference sensitivity level but with lower speed at the normal operation time of the array microphone device. Therefore, no influence such as fluctuations in sound is brought to the sound quality, such as picked up by the array microphone device, and the distortion rate is also not degraded.

In sum, this invention makes it possible to strike a balance between keeping sound quality and the high-speed convergence in the sensitivity correction.

A gain control method in an array microphone device according to this invention having a microphone array composed of a plurality of microphone units, comprises: a to-be-corrected signal input step for inputting by a to-be-corrected signal input section a signal from a microphone unit to be corrected out of the plurality of microphone units as a signal to be corrected; a reference signal input step for inputting a reference signal by a reference signal input section; a gain variable step for amplifying or attenuating the signal to be corrected so that a level of the signal to be corrected and a level of the reference signal is substantially equal to each other; and a gain control step for controlling a gain at the time of amplifying or attenuating the signal to be corrected, wherein: the gain control step includes: a first gain update step for changing the gain with a first amount of change per unit time upon time elapsed since the array microphone device is starting-up being below a predetermined period of time; and a second gain update step for changing the gain with a second amount of change per unit time upon the elapsed time being above or equal to the predetermined period of time, the second amount of change being smaller than the first amount of change.

The method realizes a quick adjustment in the sensitivity of the microphone unit, which is to be corrected to a reference level at the time of starting-up the array microphone device. Thereby, it is possible to withhold degradation in performance due to directivity synthesis failure, and shorten the inspection time at the inspection stage in manufacturing, which turns out reducing the manufacturing cost.

Furthermore, after the start-up operation, the sensitivity of the microphone unit can be also adjusted to the reference sensitivity level but with lower speed at the normal operation time of the array microphone device. Therefore, no influence such as fluctuations in sound is brought to the sound quality, such as picked up by the array microphone device, and the distortion rate is also not degraded.

In sum, this invention makes it possible to strike a balance between keeping sound quality and the high-speed convergence in the sensitivity correction.

According to the present invention, it is possible to keep sound quality and also achieve a high-speed convergence in the sensitivity correction.

DETAILED DESCRIPTION OF THE EXEMPLARY EMBODIMENTS

Embodiments of the present invention will be described below in detail with reference to drawings.

First Embodiment

Figure 1:
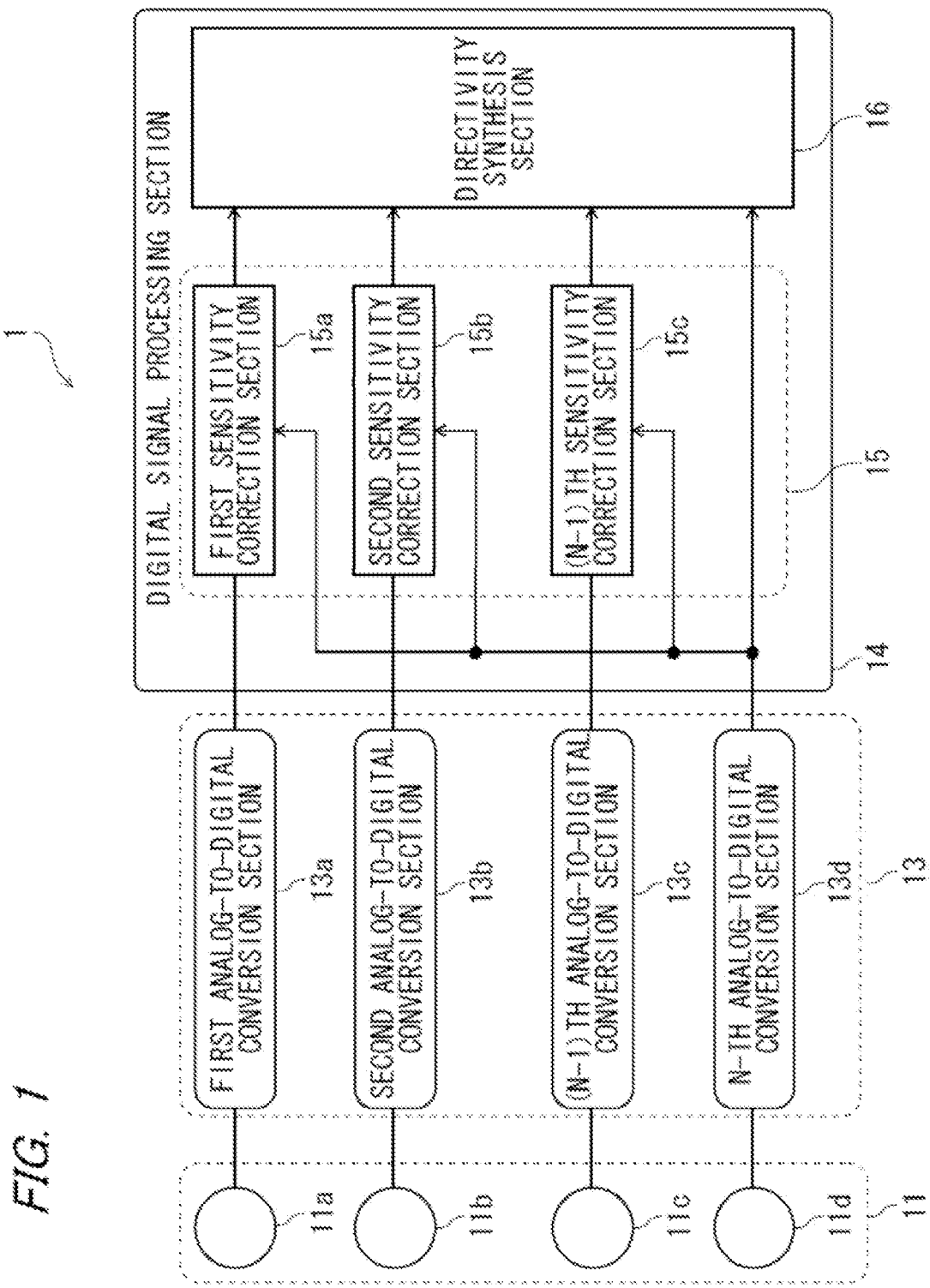
FIG. 1 is a block diagram showing a structural example of an array microphone device according to a first embodiment of the present invention.

FIG. 1 is a block diagram showing a structural example of an array microphone device according to a first embodiment of the present invention. An array microphone device 1 shown in FIG. 1 is structured with a microphone array 11, an analog-to-digital conversion section (hereinafter referred to as an A/D conversion section) 13, and a digital signal processing section 14.

The microphone array 11 is provided with a first microphone unit 11a, a second microphone unit 11b, an (N–1)th microphone unit 11c, and an N-th microphone unit 11d. Each of the microphone units 11a to 11d is aligned in line. In addition, the number of microphone units is not limited to this. Besides, although each of the microphone units 11a to 11d generally has the acoustic characteristic similar to one another, the levels of signals to be output may differ depending on an external environment, duration of use, etc.

The AD conversion section 13 is provided with a first AD conversion section 13a to which the first microphone unit 11a is connected, a second AD conversion section 13b to which the second microphone unit 11b is connected, an (N–1)th AD conversion section 13c to which the (N–1)th microphone unit 11c is connected, and an N-th AD conversion section 13d to which the N-th microphone unit 11d is connected. The AD conversion section 13 (each of the AC conversion sections 13a to 13d) converts an analog signal from the microphone array 11 into a digital signal.

The digital single processing section 14 is connected with each of the AD conversion sections 13a to 13d to execute various types of digital signal processing on digital signals from each of the AD conversion sections 13a to 13d. Furthermore, the digital signal processing section 14 is provided with a sensitivity correction section 15 and a directivity synthesis section 16. Furthermore, the digital signal processing section 14 includes known CPU, ROM, RAM and the like integrated thereinto, and the integrated CPU executes a program stored in the ROM so as to achieve the sensitivity correction function by the sensitivity correction section 15 and the directivity synthesis function by the directivity synthesis section 16.

The sensitivity correction section 15 is provided with a first sensitivity correction section 15a corresponding to the first microphone unit 11a, a second sensitivity correction section 15b corresponding to the second microphone unit 11b, and an (N–1)th sensitivity correction section 15c corresponding to the (N–1)th microphone unit 11c. The sensitivity correction section 15 (each of the sensitivity correction sections 15a to 15c) will be described below in detail.

The directivity synthesis section 16 synthesizes each of the digital signals (output signals from each of the sensitivity correction sections 15a to 15c) whose sensitivity is corrected by the sensitivity correction section 15 so as to direct the directivity in a particular direction. For example, the directivity synthesis section 16 is composed of an adaptive filter and an adder (not shown), and can define the directivity characteristic by changing the operation coefficient.

Then, an operational example of the array microphone device 1 will be described.

A sound wave picked up by the microphone array 11 is converted into a digital signal through each of the microphone units 11a to 11d and each of the A/D conversion sections 13a to 13d. In the digital signal processing section 14, the converted digital signal undergoes the processing by each of the sensitivity correction sections 15a to 15c and the processing by the directivity synthesis section 16. For example, a sampling frequency of a digital signal is 16 kHz, and the digital signal processing section 14 also operates at that frequency.

Each of the sensitivity correction section 15a to the sensitivity correction section 15c receives the output signal input as a reference signal from the N-th microphone unit 13d, where the sensitivity of each of the microphone units 11a to 11c is corrected so that the level of the output signal from each of the sensitivity correction sections 15a to 15c is substantially equal to the level of the signal from the N-th microphone unit 13d. As a result, the input signals to the directivity synthesis section 16 become at the same level even if there is a variation in sensitivity of each of the microphone units 11a to 11c. Therefore, the directivity characteristic by the directivity synthesis section 16 can be acquired correctly.

Then, the detail of the sensitivity correction section 15 will be described.

Figure 2:
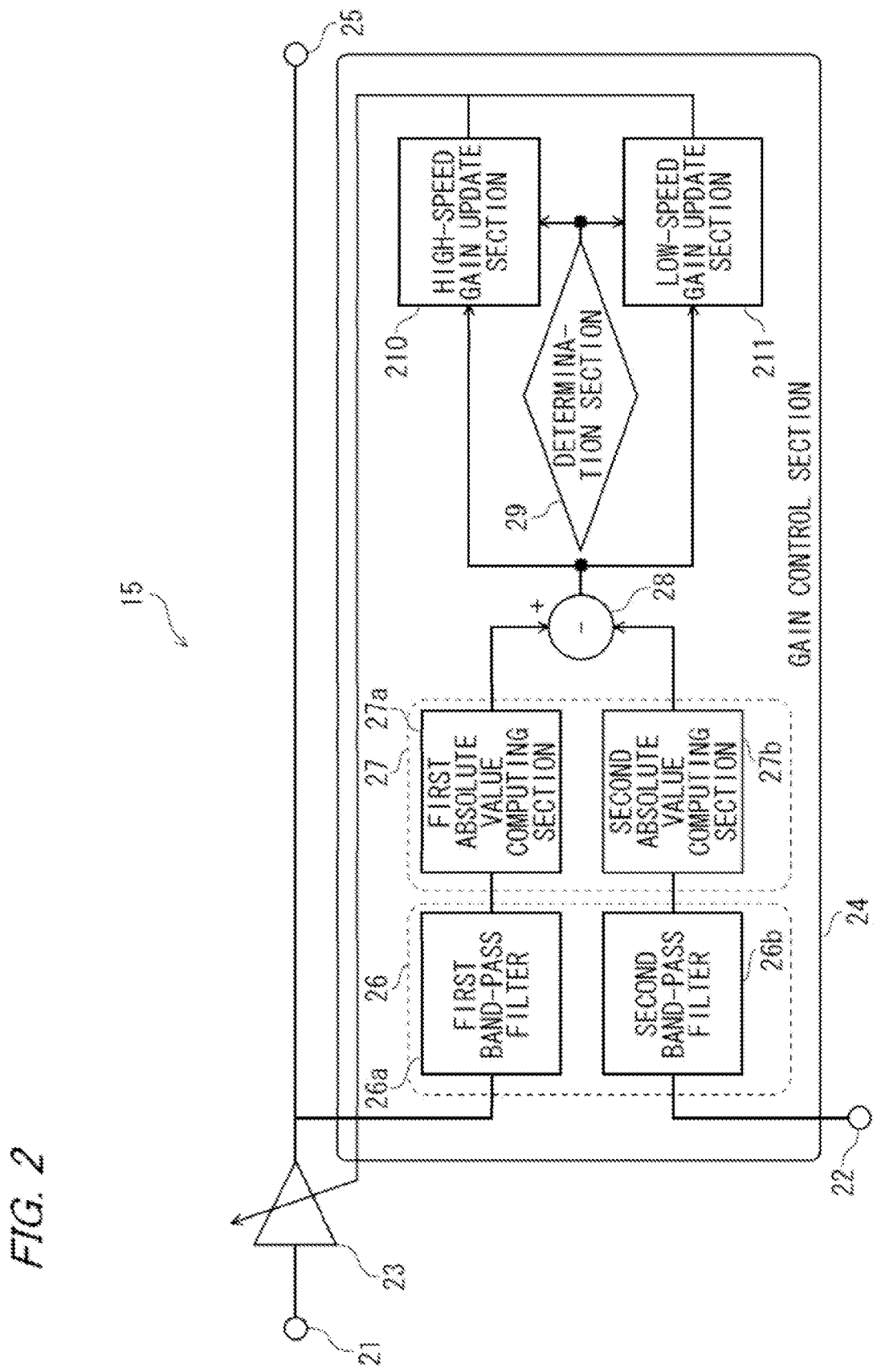
FIG. 2 is a block diagram showing a structural example of a sensitivity correction section according to a first embodiment of the present invention.

FIG. 2 is a block diagram showing a structural example of the sensitivity correction section 15 (each of the sensitivity correction sections 15a to 15c). As shown in FIG. 2, the sensitivity correction section 15 is provided with a signal input section 21, a reference signal input section 22, a gain variable section 23, a gain control section 24, and a signal output section 25.

The signal input section 21 inputs a digital signal from any of each of the A/D conversion sections 13a to 13c corresponding to any of each of the microphone units 11a to 11c to be corrected, as a signal to be corrected. For example, in the case of the sensitivity correction section 15a, a digital signal is input from the A/D conversion section 13a corresponding to the microphone unit 11a to be corrected.

The reference signal input section 22 inputs a digital signal from the N-th A/D conversion section 13d corresponding to the N-th microphone unit 11d as a reference signal to be a reference. More specifically, a signal is input as a reference signal from a microphone unit other than the microphone units 11a to 11c to be corrected out of a plurality of microphone units. In addition, the signal is not one that is contained in the microphone unit, but the reference signal from outside of the array microphone device 1 may be input.

The gain variable section 23 amplifies or attenuates the level of the signal from any of each of the A/D conversion sections 13a to 13c corresponding to each of the microphone units 11a to 11c to be corrected. At this time, the gain variable section 23 amplifies or attenuates the signal to be corrected so that the amplification or attenuation resultingly makes the level of the signal to be corrected and the level of the reference signal substantially equal to each other. For example, the signal to be corrected is amplified or attenuated so that the level of the signal to be corrected from the microphone unit 11a and the level of the reference signal from the microphone unit 11d are substantially equal to each other.

The gain control section 24 controls the amplification amount or the attenuation amount (gain) when the gain variable section 23 amplifies or attenuates the signal to be corrected. The detail of the gain control section 24 will be described below.

The signal output section 25 is an output terminal and the like for outputting a signal amplified or attenuated by the gain variable section 23, i.e., an output signal from the gain variable section 23, to the directivity synthesis section 16.

Then, the detail of the gain control section 24 will be described.

As shown in FIG. 2, the gain control section 24 is provided with a band-pass filter 26, an absolute value computing section 27, a subtraction section 28, a determination section 29, a high-speed gain update section 210, and a low-speed gain update section 211.

The band-pass filter 26 is provided with a first band-pass filter 26a which limits a passband of an output signal from the gain variable section 23, and a second band-pass filter 26b which limits a passband of a reference signal from the reference signal input section 22. These passbands are the passbands identical to each other.

The absolute value computing section 27 is provided with a first absolute value computing section 27a which computes an absolute value of a signal from the first band-pass filter 26a, and a second absolute value computing section 27b which computes an absolute value of a signal from the second band-pass filter 26b.

The subtraction section 28 subtracts the result computed by the second absolute value computing section 27b from the result computed by the first absolute value computing section 27a.

The determination section 29 selects either the high-speed gain update section 210 or the low-speed gain update section 211 in order to update the gain. For example, the determination section 29 determines whether or not the time elapsed since the array microphone device 1 is start-up is below a predetermined period of time (such as one second), and selects the high-speed gain update section 210 upon being below the predetermined period of time, while selecting the low-speed gain update section 211 upon being above or equal to the predetermined period of time.

The high-speed gain update section 210 updates a gain with a relatively large updated amount of gain per unit time (a first amount of change).

The low-speed gain update section 211 updates a gain with a relatively small updated amount of gain per unit time (a second amount of change smaller than the first amount of change).

Since the sensitivity correction section 15 is structured as described above, the signal to be corrected, which comes from any of microphone units 11a to 11c to be corrected and is input to the signal input section 21, is amplified or attenuated by the gain variable section 23 in response to the gain from the gain control section 24, and then output from the signal output section 25.

Furthermore, with regard to the output signal from the gain variable section 23, the magnitude of the signal to be corrected whose band is limited by the first band-pass filter 26a is computed as the absolute value by the first absolute value computing section 27a.

On the other hand, with regard to the reference signal from the microphone unit 11d which is input from the reference signal input section 22, the magnitude of the reference signal whose band is limited by the second band-pass filter 26b is computed as the absolute value by the second absolute value computing section 27b.

Then, the description will be made regarding an example of a gain update by the high-speed gain update section 210 and the low-speed gain update section 211.

Figure 3:
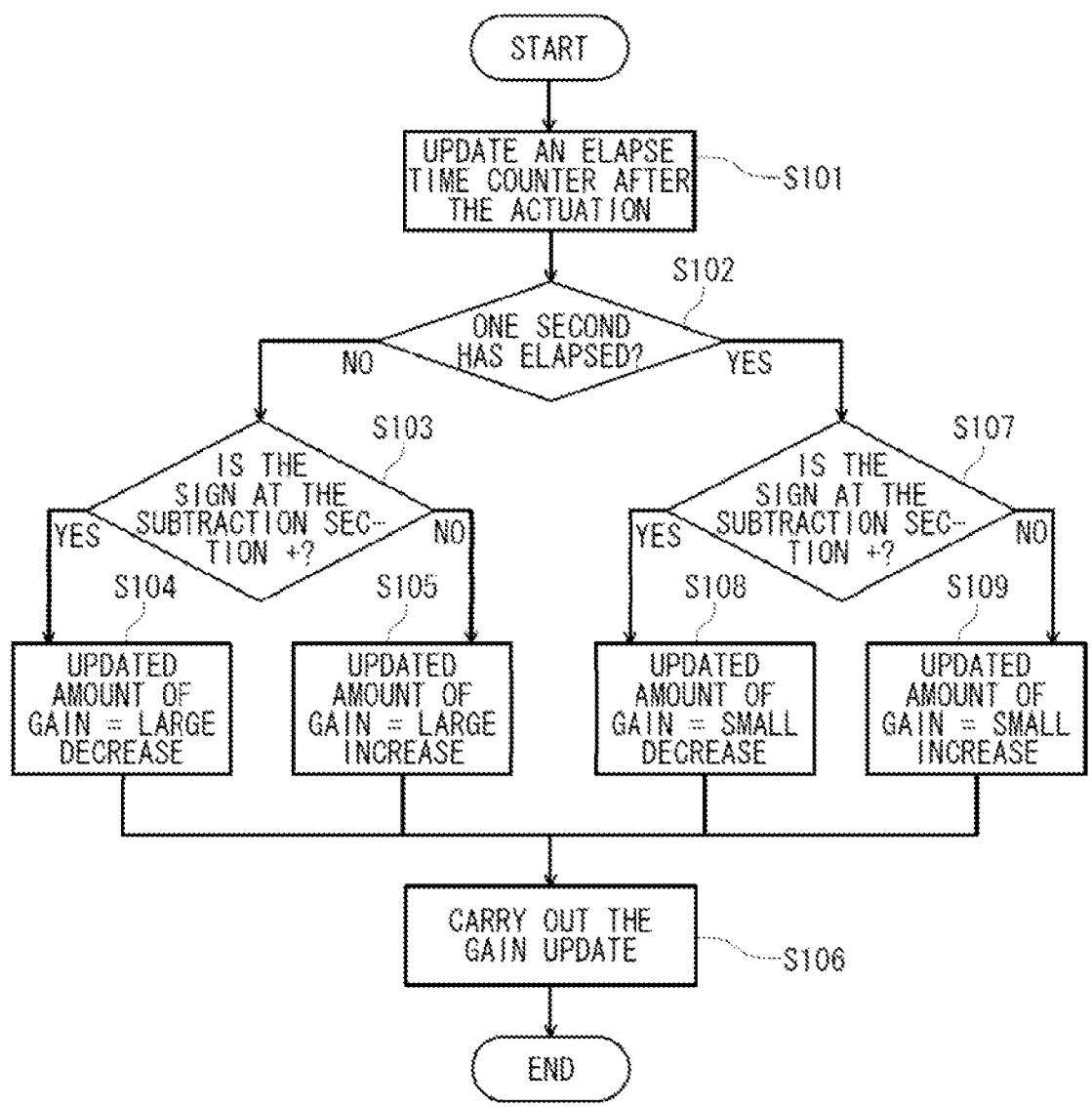
FIG. 3 is a flowchart showing an operational example of a determination section, a high-speed gain update section, and a low-speed gain update section according to a first embodiment of the present invention.

FIG. 3 is a flowchart showing an operational example of the determination section 29, the high-speed gain update section 210, and the low-speed gain update section 211 of the present embodiment.

Here, it is assumed that ±4 dB at the maximum is the difference in sensitivity (difference in gain) between any of the microphone units 11a to 11c to be corrected and the microphone unit 11d to be the reference, and the gain is required to be amplified for ±4 dB by the gain variable section 23. Furthermore, the specification is set so that the gain is converged within one second after the start-up and the updated amount of gain is very small after one second and the time subsequent thereto so as to exert no influence on the sound quality. In addition, one second is an example.

When the array microphone device 1 is turned on and start-up, an elapse time counter (not shown) in the digital signal processing section 14 carries out the update operation for each sampling period, i.e, starts timing (step S101). Then, the determination section 29 determines whether or not the elapse time counter has counted less than one second (step S102). If the elapse time counter has counted one second or more, the determination section 29 selects the high-speed gain update section 210 (No at step S102).

Subsequently, the high-speed gain update section 210 determines whether or not the result of the subtraction by the subtraction section 28 is positive (step S103). If the subtracted result by the subtraction section 28 is positive, it means that the level of the signal to be corrected from the gain variable section 23 is higher than the level of the reference signal, and thus the high-speed gain update section 210 carries out the update for decreasing the gain (step S104). At this time, the high-speed gain update section 210 is set the updated amount of gain per one sampling period to be, for example, −0.00025 dB (corresponding to −4 dB at 16000 samples that is the number of samples for one second).

Furthermore, if the result of the subtraction by the subtraction section 28 is negative, it means that the level of the signal to be corrected from the gain variable section 23 is lower than the level of the reference signal, and thus the high-speed gain update section 210 carries out the update for increasing the gain (step S105). At this time, the high-speed gain update section 210 sets the updated amount of gain per one sampling period to be, for example, +0.00025 dB (corresponding to +4 dB at 16000 samples that is the number of samples for one second).

Then, the high-speed gain update section 210 updates the gain with the updated amount of gain concerned, and then sets the gain in the gain variable section 23 (step S106).

In this manner, the high-speed gain update section 210 speedily corrects the difference in sensitivity corresponding to the result of the subtraction by the subtraction section 28 with a predetermined period of time after the start-up (such as one second). It is thus possible to shorten the duration to the degradation of directivity during the sensitivity correction (during the gain update), and also cut the waiting time at the inspection stage down to the predetermined period of time mentioned above (such as one second).

On the other hand, if the elapse time counter has counted one second or more, the determination section 29 selects the low-speed gain update section 211 (Yes at step S102).

Subsequently, the high-speed gain update section 210 determines whether or not the result of the subtraction by the subtraction section 28 is positive (step S107). If the result of the subtraction by the subtraction section 28 is positive, it means that the level of the signal to be corrected from the gain variable section 23 is higher than the level of the reference signal, and thus the low-speed gain update section 211 carries out the update for decreasing the gain (step S108). At this time, the updated amount of gain per one sampling period is set to be, for example, −0.0000025 dB (corresponding to −0.04 dB at 16000 samples that is the number of samples for one second).

Furthermore, if the result of the subtraction by the subtraction section 28 is negative, it means that the level of the signal to be corrected from the gain variable section 23 is lower than the level of the reference signal, and thus the low-speed gain update section 211 carries out the update for increasing the gain (step S109). At this time, the updated amount of gain per one sampling period is set to be, for example, +0.0000025 dB (corresponding to +0.04 dB at 16000 samples that is the number of samples for one second).

Then, the low-speed gain update section 211 updates the gain with the updated amount of gain concerned, and then sets the gain in the gain variable section 23 (step S106).

In this manner, the low-speed gain update section 211 confines the updated amount of gain on the order of ±0.04 dB per one second. Thus, even though the update of the gain is always conducted, the sound quality does not become degraded and the update operation can be prevented from being auditorily recognized.

Then, the description will be made regarding an example of the update of the gain updated by the high-speed gain update section 210 and the low-speed gain update section 211.

Figure 4A:
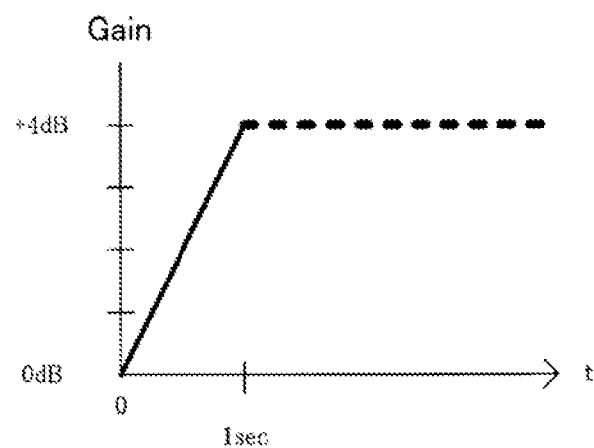
FIG. 4A is a diagram showing an example of a gain update at the time of high-speed gain update according to a first embodiment of the present invention.
Figure 4B:
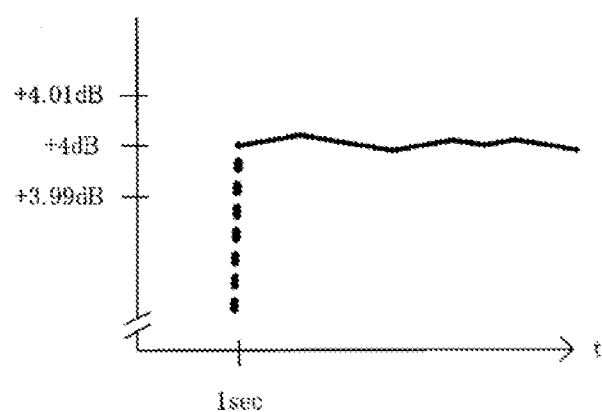
FIG. 4B is a diagram showing an example of a gain update at the time of low-speed gain update according to a first embodiment of the present invention.
Figure 4C:
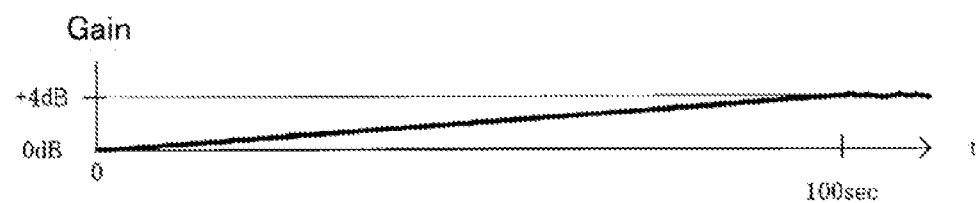
FIG. 4C is a diagram showing a gain update at the time of the conventional gain update.

FIGS. 4A to 4C show the case where the sensitivity of the microphone units 11a to 11c to be corrected is lower for 4 dB than that of the microphone unit 11d as the reference, i.e., the example of the gain update in the case where 4 dB of amplification is required by the gain variable section 23.

FIG. 4A is a diagram showing an example of the gain update by the high-speed gain update section 210. Referring to FIG. 4A, it can be understood that the gain is converged to be +4 dB in one second after the start-up of the array microphone device 1. Furthermore, as shown in FIG. 4A, the updated amount of gain by the high-speed gain update section 210 (the first amount of change) is, for example, the amount of change based on the difference between the signal to be corrected and the reference signal and on the duration in which the high-speed gain update section 210 carries out the gain update (such as one second after the start-up), that is 1 dB or more per one second.

FIG. 4B is a diagram showing an example of the gain update by the low-speed gain update section 211. Referring to FIG. 4B, it can be understood that gain is maintained to be +4 dB after one second after the start-up and the time subsequent thereto, and the fluctuation in gain is suppressed to the level exerting no influence on the sound quality. More specifically, the updated amount of gain by the low-speed gain update section 211 (the second amount of change) is the amount of change which is not auditorily perceptible, such as below 1 dB per one second.

FIG. 4C is a diagram showing a conventional gain update. Referring to FIG. 4C, assuming that the updated amount of gain per one sampling period to the extent of exerting no influence on the sound quality is +0.0000025 dB, it can be understood that the time of 100 seconds is required to converge the gain to be +4 dB.

Then, the description will be made regarding a frequency characteristic of the directivity depending on the presence of the sensitivity correction (gain update).

Figure 5A:
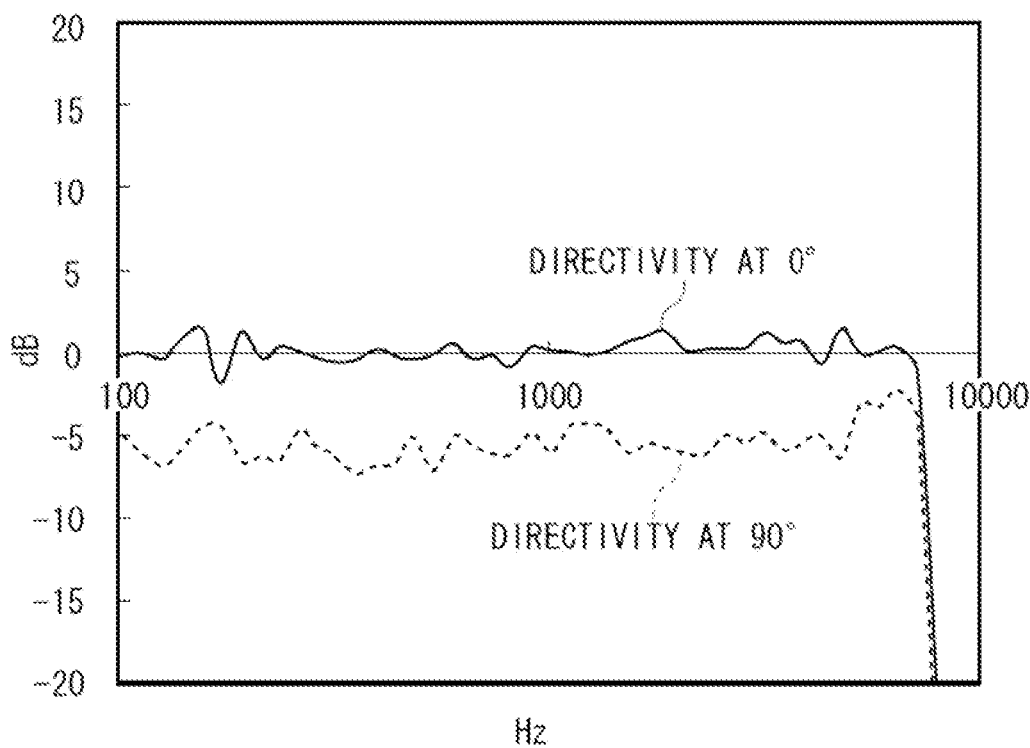
FIG. 5A is a diagram showing an example of a frequency characteristic at the time of synthesizing the directivity by a directivity synthesis section in the case where the sensitivity correction is conducted in the first embodiment of the present invention.
Figure 5B:
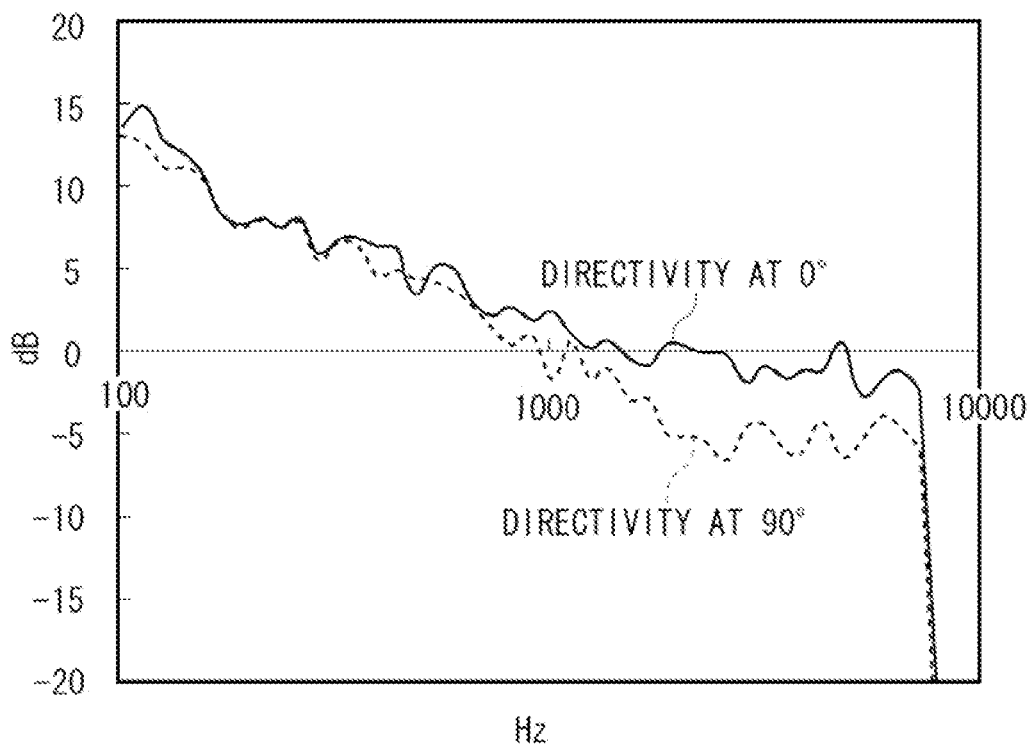
FIG. 5B is a diagram showing an example of a frequency characteristic at the time of synthesizing the directivity by a directivity synthesis section in the case where the sensitivity correction is not conducted in the first embodiment of the present invention.

FIGS. 5A and 5B show frequency characteristics of the directivity at 0° and 90° in the case where the directivity synthesis is carried out by the directivity synthesis section 16 of the array microphone device 1 in two microphone units. Furthermore, FIG. 5A shows the case where 4 dB of sensitivity correction is conducted, and FIG. 5B shows the case where 4 dB of sensitivity correction is not conducted.

Referring to FIG. 5A, it can be understood that, if the sensitivity correction according to the present invention is conducted, a flat frequency characteristic is acquired as the directivity at 0°, and a flat frequency characteristic decreased for approximately 6 dB from the frequency characteristic of the directivity at 0° is acquired as a flat frequency characteristic at 90°. Therefore, it can be understood that the directivity characteristics as designed can be acquired. On the other hand, referring to FIG. 5B, if the sensitivity correction according to the present invention is not conducted, both the frequency characteristic of the directivity at 0° and the frequency characteristic of the directivity at 90° do not become flat. Therefore, it can be understood that the directivity characteristics as designed cannot be acquired.

In accordance with the array microphone device 1 of this type of the present embodiment, the gain in the gain variable section 23 is increased and decreased at high speed at the time of start-up the array microphone array device 1, while increased and decreased with lower speed at the normal operation time, so that the level of each of the output signals from the sensitivity correction sections 15a to 15c (the signals to be corrected whose sensitivities are corrected) is substantially equal to the level of the signal (the reference signal) from the N-th microphone unit 11d. It is thus possible to strike a balance between keeping the high-speed convergence in the sensitivity correction (gain update) and keeping sound quality.

Second Embodiment

Figure 6:
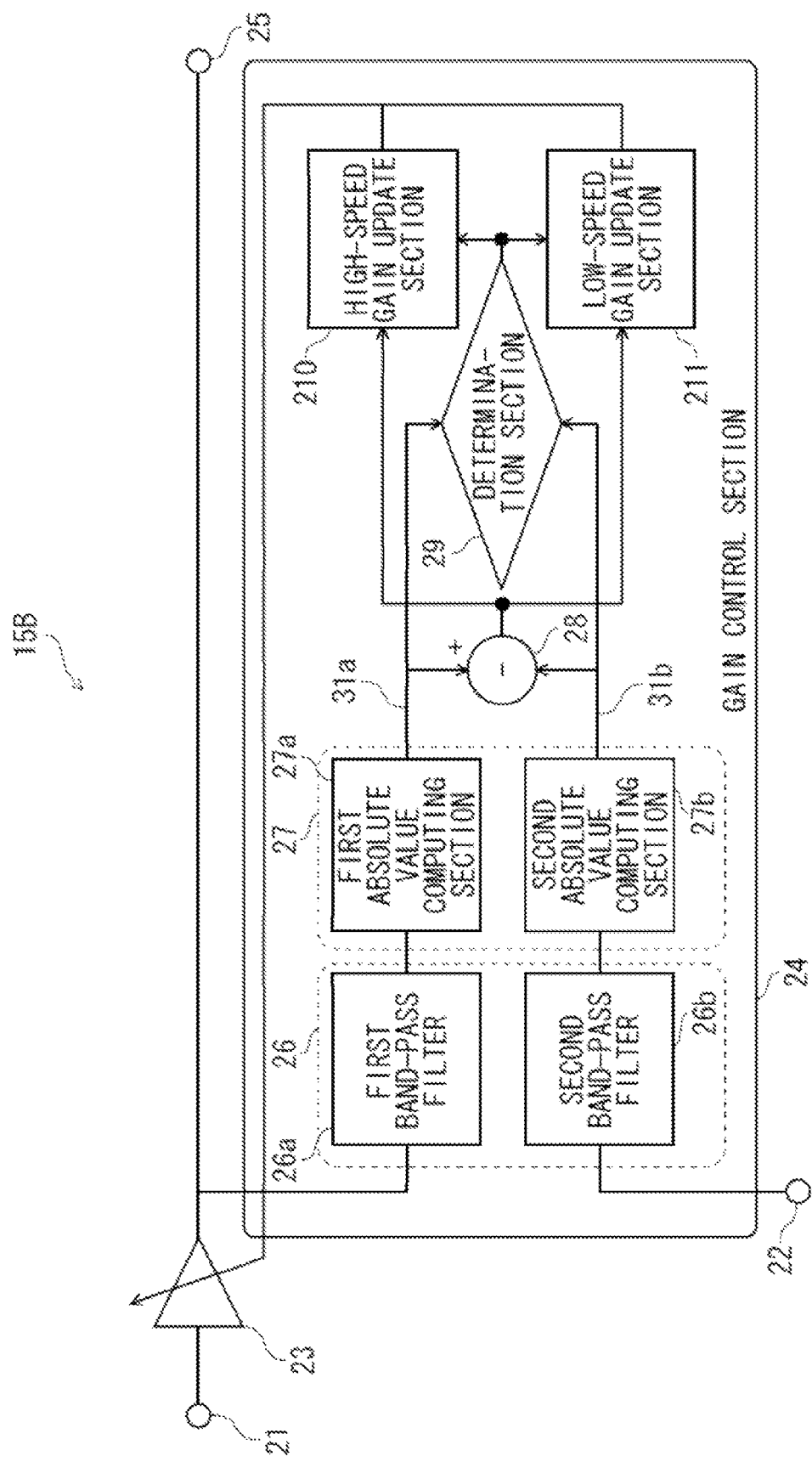
FIG. 6 is a block diagram showing a structural example of a sensitivity correction section according to a second embodiment of the present invention.

FIG. 6 is a block diagram showing a structural example of a sensitivity correction section 15B (each of the sensitivity correction sections 15a to 15c) in a second embodiment of the present invention. The structure of the sensitivity correction section 15B shown in FIG. 6 of the present embodiment is basically similar to that of the sensitivity correction section 15 shown in FIG. 2 in the first embodiment. In the sensitivity correction section 15B shown in FIG. 6, same reference numerals are given to components having the same function as those in the sensitivity correction section 15 shown in FIG. 2, and the explanation thereof will be omitted. The difference between FIG. 6 and FIG. 2 is that an output signal 31a from a first absolute value computing section 27a and an output signal 31b from a second absolute value computing section 27b are input to the determination section 29. In addition, the structure other than the sensitivity correction section 15B in the array microphone device 1 of the present embodiment has the same structure as that of the array microphone device 1 in the first embodiment, so that the explanation will be omitted.

Figure 7:
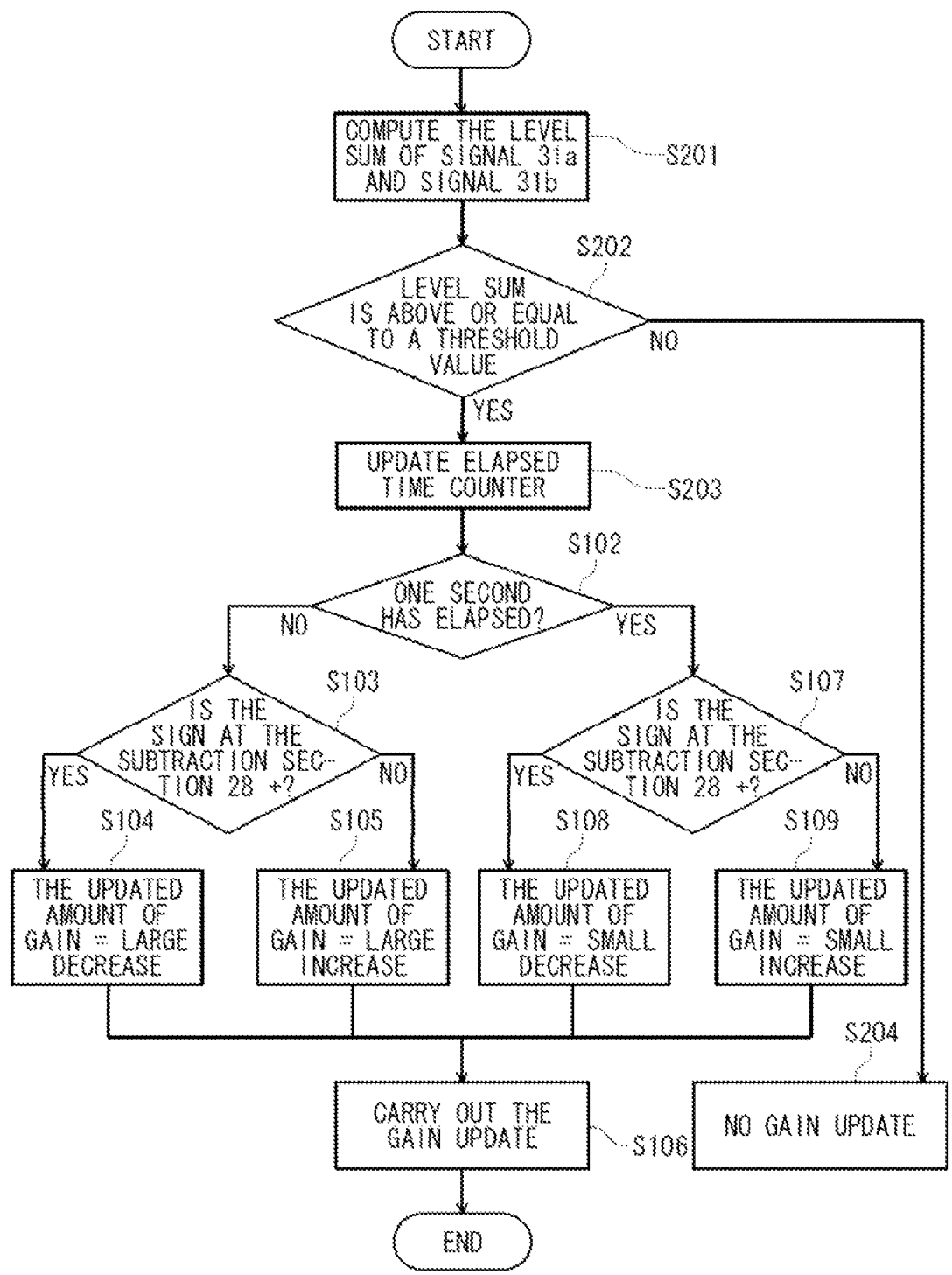
FIG. 7 is a flowchart showing an operational example of a determination section, a high-speed gain update section, and a low-speed gain update section according to a second embodiment of the present invention.

FIG. 7 is a flowchart showing an operational example of the determination section 29, the high-speed gain update section 210, and the low-speed gain update section 211.

When the array microphone device 1 is turned on and start-up, the determination section 29 computes a level sum of the level of the output signal 31a and the level of the output signal 31b (step S201). Then, it is determined whether or not the level sum is above a threshold value (step S202). As the threshold value discussed here, a residual noise of the microphone units 11a to 11c (such as −60 dBFS) is conceivable, for example.

If it is determined that the level sum is above the threshold value, the elapse time counter carries out the update operation in the digital signal processing section 14, i.e., starts timing (step S203). The subsequent operations are similar to steps S102 to S109 in FIG. 3. On the other hand, if the level sum is less than or equal to the threshold value, the gain control section 24 does not update the gain in the gain variable section 23 (step S204).

In this manner, the array microphone device 1 of the present embodiment changes the gain by the high-speed gain update section 210 (an example of the first gain update section) when the time elapsed since the sum of the level of the signal to be corrected and the level of the reference signal is below the predetermined value, while changing the gain by the low-speed gain update section 211 (an example of the second gain update section) when the elapsed time described above is above or equal to the predetermined period of time.

Therefore, only when the sound is sufficiently picked up by the microphone units 11a to 11c to be corrected and the microphone unit 11d as the reference, the high-speed gain update section 210 and the low-speed gain update section 211 operate so as to make it possible to prevent an unstable level determination because of the very low level.

In addition, the sampling frequency, the gain, the operating time of the high-speed gain update section 210, the threshold value and the like are not limited to those described above. Furthermore, the high-speed gain update section 210 may determine the updated amount of gain from the gain and the acceptable correction time. Furthermore, the low-speed gain update section 211 may set the updated amount of gain to be the amount of change in level that does not give a feeling of being unreasonable auditorily. In this case, 0.1 dB or less per one second is desirable, for example.

While the present invention has been described in detail, or with reference to the specific embodiments, it is apparent for those skilled in the art that the invention may be modified and changed in various manners without departing from the scope and spirit of the invention.

The present invention is useful for an array microphone device and the like which keeps sound quality as well as achieves a high-speed convergence in sensitivity correction.

What is claimed is:

1. An array microphone device having a microphone array composed of a plurality of microphone units, comprising:
   a to-be-corrected signal input section configured to input a signal from a microphone unit to be corrected out of the plurality of microphone units as a signal to be corrected;
   a reference signal input section configured to input a reference signal;
   a gain variable section configured to amplify or attenuate the signal to be corrected so that a level of the signal to be corrected and a level of the reference signal is substantially equal to each other; and
   a gain control section configured to control a gain at the time of amplifying or attenuating the signal to be corrected, wherein:
   the gain control section includes:
   a first gain update section configured to change the gain with a first amount of change per unit time upon time elapsed since the array microphone device is starting-up being below a predetermined period of time; and
   a second gain update section configured to change the gain with a second amount of change per unit time upon the elapsed time being above or equal to the predetermined period of time, the second amount of change being smaller than the first amount of change,
   wherein the gain control section changes the gain by the first gain update section if a sum of the level of the signal to be corrected and the level of the reference signal is above the predetermined value and the time elapsed since the sum went above the predetermined value is below the predetermined period of time, and
   the gain control section changes the gain by the second gain update section if the sum is above the predetermined value and the time elapsed since the sum went above the predetermined value is above or equal to the predetermined period of time.

2. The array microphone device according to claim 1, wherein the reference signal input section inputs the signal from a microphone unit other than the microphone unit to be corrected out of the plurality of microphone units, as the reference signal.

3. The array microphone device according to claim 1, wherein the first amount of change is the amount of change based on a difference between the level of the signal to be corrected and the level of the reference signal, and the predetermined period of time.

4. The array microphone device according to claim 1, wherein the second amount of change is the amount of change that is auditorily unperceivable.

5. The array microphone device according to claim 1, wherein:
the first amount of change is 1 dB or more per one second; and
the second amount of change is below 1 dB per one second.

6. A gain control method in an array microphone device having a microphone array composed of a plurality of microphone units, comprising:
a to-be-corrected signal input step for inputting by a to-be-corrected signal input section a signal from a microphone unit to be corrected out of the plurality of microphone units as a signal to be corrected;
a reference signal input step for inputting a reference signal by a reference signal input section;
a gain variable step for amplifying or attenuating the signal to be corrected so that a level of the signal to be corrected and a level of the reference signal is substantially equal to each other; and
a gain control step for controlling a gain at the time of amplifying or attenuating the signal to be corrected, wherein:
the gain control step includes:
a first gain update step for changing the gain with a first amount of change per unit time upon time elapsed since the array microphone device is starting-up being below a predetermined period of time; and
a second gain update step for changing the gain with a second amount of change per unit time upon the elapsed time being above or equal to the predetermined period of time, the second amount of change being smaller than the first amount of change,
wherein the gain control update step changes the gain utilizing the first gain update step section if a sum of the level of the signal to be corrected and the level of the reference signal is above the predetermined value and the time elapsed since the sum went above the predetermined value is below the predetermined period of time, and
the gain control update step changes the gain by the second gain update step if the sum is above the predetermined value and the time elapsed since the sum went above the predetermined value is above or equal to the predetermined period of time.

* * * * *